June 7, 1960

W. G. LEE 2,940,018

PRINTED ELECTRIC CIRCUITS

Original Filed April 11, 1955

INVENTOR.
Warren G. Lee

BY

Smith, Olsen, Baird & Miller,
Attys.

United States Patent Office 2,940,018

Patented June 7, 1960

2,940,018

PRINTED ELECTRIC CIRCUITS

Warren G. Lee, East Chicago, Ind., assignor to General American Transportation Corporation, Chicago, Ill., a corporation of New York Original application Apr. 11, 1955, Ser. No. 500,641. Divided and this application Apr. 10, 1957, Ser. No. 651,985

9 Claims. (Cl. 317—101)

The present invention relates to printed electric circuits. This application is a division of the copending application of Warren G. Lee, Serial No. 500,641, filed April 11, 1955, and now abandoned.

In accordance with a conventional method of making a printed electric circuit, an adhesive layer (a resin-rubber base type layer) is applied to a previously sheared and punched insulating board (a laminate comprising a textile reinforced thermoset resin consisting essentially of phenolformaldehyde condensation products), and thereover a thin coating of metallic silver is laid down (employing a silk screen step for pattern-control) by applying an aqueous solution of a silver salt and a reducing agent. Thereafter hollow rivets or eyelets are secured into the holes previously punched in the board in order to provide terminals for the circuit elements of the printed electric circuit.

This conventional method of making printed electric circuits is subject to several serious drawbacks:

(*a*) The silver coating does not always adhere properly;

(*b*) The rivets or eyelets employed as electrical terminals do not always make good electrical contact with the circuit elements and also require an assembly operation; and (*c*) The silver ions migrate through the adhesive layer and through the insulating board, after a time interval, thereby impairing the dielectric properties of the insulating board, so as to render inoperative capacitative circuit elements of the printed electric circuit.

Accordingly, it is a general object of the invention to provide an improved printed electric circuit that is not subject to the drawbacks noted.

Another object of the invention is to provide a printed electric circuit of improved and simplified construction and arrangement in which the electrical circuit elements are securely bonded to the supporting insulating base and are not subject to variation in electrical characteristics in use.

A further object of the invention is to provide an improved printed electric circuit that employs no silver or other expensive electric conducting materials.

A further object of the invention is to provide a printed electric circuit comprising an insulating supporting base, a nickel-phosphorus alloy layer intimately bonded to the surface of the base and a copper layer intimately bonded to the alloy layer.

Further features of the invention pertain to the particular arrangement of the elements of the printed electric circuit, whereby the above-outlined and additional operating features thereof are attained.

The invention, both as to its organization and principle of operation, together with further objects and advantages thereof, will best be understood by reference to the following specification taken in connection with the accompanying drawing, in which.

Figures 1, 2, 3, 4, 5, 6, 7, 8, 9, 10, 11, 12:
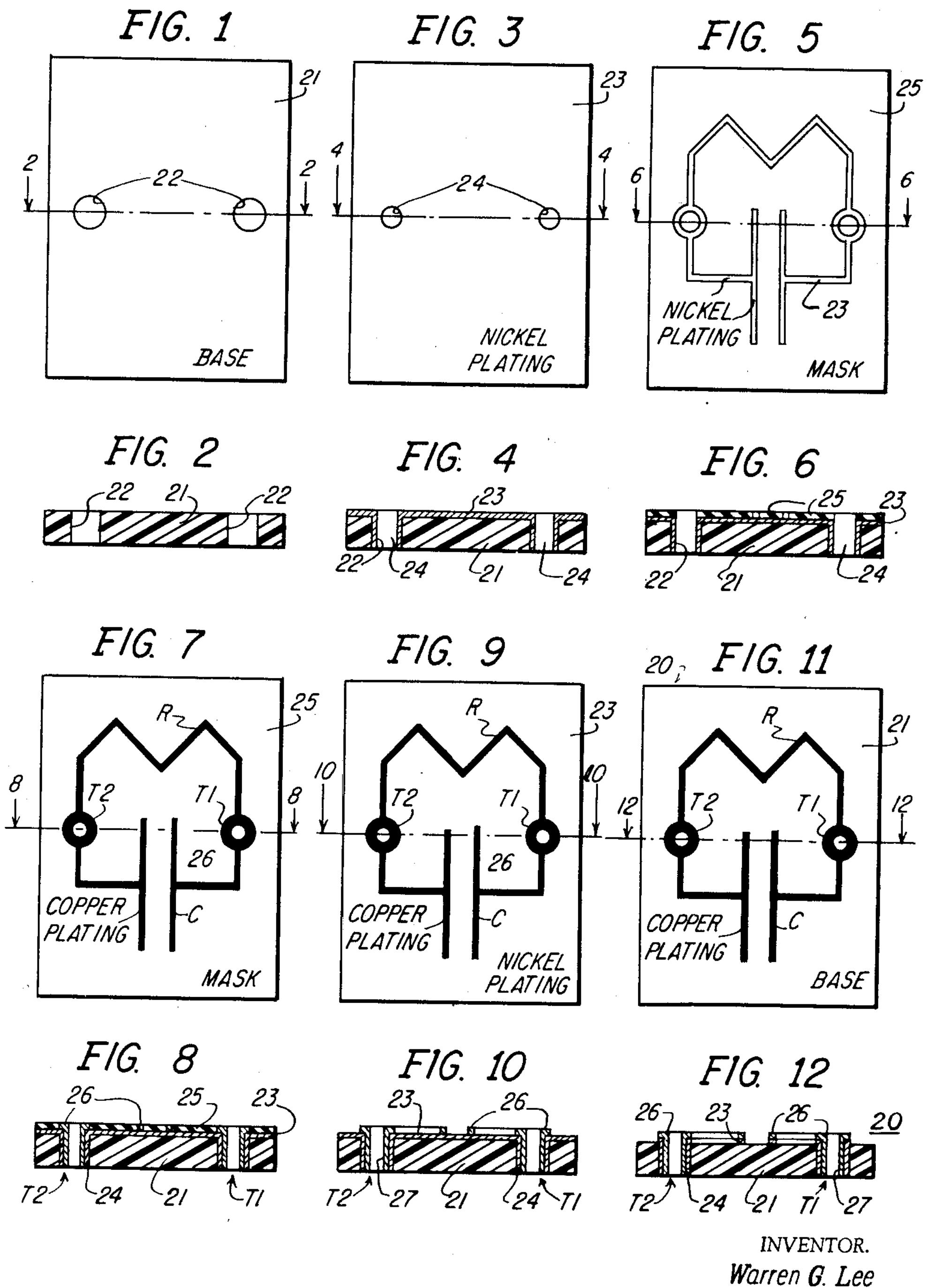
Figure 1 is a plan view of a sheet of insulating board after it has been sheared and a pair of holes have been pierced therethrough, and comprising the supporting element of a printed electric circuit.
Fig. 2 is a vertical sectional view of the board taken in the direction of the arrows along the line 2—2 in Fig. 1.
Fig. 3 is a plan view of the board of Fig. 1 after a layer of nickel-phosphorus alloy has been chemically plated upon the upper surface thereof and upon the surfaces thereof surrounding the pair of holes therein to define a pair of electrical terminals in the respective holes therein.
Fig. 4 is a vertical sectional view of the board taken in the direction of the arrows along the line 4—4 in Fig. 3.
Fig. 5 is a plan view of the board of Fig. 3 carrying an electrically insulating organic masking layer upon the upper surface of the alloy layer, the masking layer having openings therein depicting the outlines of a resistor and a capacitor extending between the pair of terminals carried thereby.
Fig. 6 is a vertical sectional view of the board taken in the direction of the arrows along the line 6—6 in Fig. 5.
Fig. 7 is a plan view of the board of Fig. 5 after a copper layer has been electroplated upon the surfaces of the alloy layer that are exposed through the openings in the masking layer and upon the exposed surfaces of the pair of terminals, whereby the resistor and the capacitor are electrically connected in parallel relation between the pair of terminals.
Fig. 8 is a vertical sectional view of the board taken in the direction of the arrows along the line 8—8 in Fig. 7.
Fig. 9 is a plan view of the board of Fig. 7 after the masking layer has been dissolved and removed therefrom.
Fig. 10 is a vertical sectional view of the board taken in the direction of the arrows along the line 10—10 in Fig. 9.
Fig. 11 is a plan view of the board of Fig. 9 after the exposed portion of the alloy layer has been dissolved and removed therefrom, and consequently the finished printed electric circuit.
Fig. 12 is a vertical sectional view of the finished printed electric circuit taken in the direction of the arrows along the line 12—12 in Fig. 11.

In Figs. 2, 4, 6, 8, 10 and 12, the thickness of the board, the layers, etc., have been greatly exaggerated; and in Figs. 5, 7, 9 and 11, the thickness of the outlines of the resistor and the capacitor have been greatly exaggerated; these exaggerated dimensions being so employed for the purpose of better illustration.

Referring now to the drawing, the construction and arrangement of the printed electric circuit will best be understood from the following description of the method of making the same; however, it is noted that the finished printed electric circuit 20 is shown in Figs. 11 and 12 as comprising an insulating board 21 carrying on the front surface thereof a printed circuit consisting of a resistor R and a capacitor C connected in parallel relation between a pair of electrical terminals T1 and T2. The parallel connection of the circuit elements R and C has no particular significance, it being employed entirely for purpose of description, and the circuit elements that are normally carried upon the rear surface of the insulating board 21 are omitted in the interest of simplicity of disclosure, since the present invention is directed to the structure of the printed electric circuit and the method of making the same, as contrasted with the composition of the printed electric circuit as employed ultimately in an electrical device, such as a radio-set, a television-set, an electric control panel, etc.

Turning now to the method of making the printed electric circuit 20 and referring to Figs. 1 and 2, first there is provided a sheared and pierced insulating board 21 that may comprise a laminate in the form of a textile reinforced thermoset resin, such, for instance, as phenol-formaldehyde condensation products. As illustrated, the board 21 is of substantially rectangular form and has a pair of spaced-apart holes 22 pierced therethrough, the board 21 having an appropriate thickness for purpose of support.

The front surface of the board 21 and the surfaces thereof surrounding the holes 22 therein are then prepared by a freshening step; which step may involve sanding, blasting, brushing, grinding, buffing, abrading, chemical etching, etc., so as to remove the "outer skin" thereof in order to eliminate any polarization of the surfaces thereof. This step produces the required surface-roughening and removal of the outside resin film from the surfaces mentioned of the board 21. Specifically, "vapor blasting" of these surfaces of the board 21 may be employed; and thereafter the board 21 is rinsed in tap water for about 5 minutes at about 60° C. Then the surfaces mentioned of the board 21 are subjected to a vapor degreasing step; and then cleaned, for instance in a mild alkaline solution that may contain some detergent and some sodium carbonate. Again, the board 21 is rinsed in tap water for about 5 minutes at about 60° C. Then the surfaces mentioned of the board 21 are acidified in an aqueous solution containing 10–20% sulfuric acid for a short time interval of about 1 to 5 minutes. Again the board 21 is rinsed as before; and next, the surfaces mentioned of the board 21 are activated in an aqueous palladium chloride solution containing about 1000 p.p.m. of $Pd^{++}$ for a time interval of about 15 to 20 minutes. This aqueous solution may contain palladium chloride in an amount of about 1.66 gms./liter. The board 21 is then dried in an oven, or with infra-red radiation, at about 80° C. for a short time interval. Next, the board 21 is immersed in a reducing solution, such, for example, as an aqueous solution containing about 0.15 m.p.l. of sodium hypophosphite or hypophosphorous acid, the immersion time being about 2 minutes. The board 21 is rinsed for 15 seconds and then immersed in an aqueous nickel strike bath at room temperature (about 70° F.) for about 10–20 minutes. The rinsing of the board 21 preceding the immersion thereof in the aqueous nickel strike bath is very important as it prevents decomposition of the nickel strike bath by the carrying over with the board 21 of adsorbed $Pd^{++}$ ions.

The nickel strike bath may have the approximate composition:

| Ingredient | m.p.l. | gm./l. |
|---|---|---|
| Nickel hypophosphite | 0.09 | 26.7 |
| Ortho-boric acid | 0.02 | 1.2 |
| Ammonium sulfate | 0.02 | 2.64 |
| Sodium acetate | 0.06 | 4.92 |

The pH of this nickel strike bath is adjusted within the approximate range 5.5 to 6.0 prior to use of sulfuric acid or sodium hydroxide being employed, as required. The plating rate of this nickel strike bath is about 0.04 mil./hr.

Next, the board 21 is rinsed in tap water, and is then pickled in sulfuric acid (10%) for about 30 seconds; and again, the board 21 is rinsed as before.

Then the board 21 is subjected to chemical nickel plating in a chemical nickel plating bath at about 200° F.–210° F. to obtain the desired thickness of the nickel layer deposited thereon (4 minutes being generally sufficient), this chemical nickel plating bath having a plating rate of about 0.9 to 1.0 mil./hour.

The most suitable chemical nickel plating bath comprises an aqueous solution and may have the approximate composition:

| | M.p.l. |
|---|---|
| Nickel sulfate | 0.09 |
| Sodium hypophosphite | 0.225 |
| Malic acid | 0.18 |
| Sodium succinate | 0.06 |

Prior to use, the pH of this bath should be adjusted in the approximate range 5.8 to 6.0 employing sulfuric acid or sodium hydroxide, as required.

Another suitable chemical nickel plating bath comprises an aqueous solution and may have the approximate composition:

| | M.p.l. |
|---|---|
| Nickel sulfate | 0.07 |
| Sodium hypophosphite | 0.23 |
| Lactic acid | 0.30 |
| Propionic acid | 0.03 |

Prior to use, the pH of this bath should be adjusted in the approximate range 4.5 to 4.7 employing sulfuric acid or sodium hydroxide, as required.

While either of the two above-described chemical nickel plating baths are entirely satisfactory for the chemical nickel plating of the prepared surfaces of the board 21, the malic-succinate bath first described is preferred since the adhesion of the nickel deposit is considerably greater employing this bath.

The above-described process of chemical nickel plating upon the surface of a non-metallic body is covered by U.S. Patent Nos. 2,690,401 and 2,690,402, granted on September 28, 1954, respectively to Gregoire Gutzeit, William J. Crehan and Abraham Krieg, and to William J. Crehan.

After the last-mentioned chemical nickel plating step, the board 21 is removed to an oven and heat-treated at a temperature of about 325° F. for a time interval of about 30 minutes in order to effect thorough drying and degassing thereof.

At this time, the previously prepared surfaces of the board 21 carry, as shown in Figs. 3 and 4, the layers of nickel 23 and 24 that have been chemically plated thereupon, the layer 23 being disposed upon the front surface of the board 21 and the layers 24 being respectively disposed upon the surfaces of the board 21 surrounding the holes 22 therein, the layers 23 and 24 being integral and intimately bonded to the prepared surfaces mentioned of the board 21. In the foregoing description of the integral layers 23 and 24, reference has been made to these layers as being formed of nickel; whereas, in fact, they comprise an alloy of nickel and phosphorus, the alloy containing about 5 to 11% phosphorus by weight. In other words, the chemical nickel plating process described above automatically and inherently results in the plating upon the prepared surfaces of the layers 23 and 24 that comprise the nickel-phosphorus alloy mentioned. Accordingly, hereinafter the layers 23 and 24 will be referred to as "alloy layers"; it being understood that the alloy referred to is the nickel-phosphorus alloy mentioned.

Recapitulating, the surfaces mentioned of the board 21 are prepared by roughening and cleaning so as to render them non-polarized; and thereafter upon immersion of the board 21 in the aqueous palladium chloride solution minute quantities of palladium chloride adhere to the prepared surfaces mentioned. Thereafter, when the board 21 is immersed in the aqueous chemical reducing solution these minute quantities of palladium chloride are reduced to metallic palladium so as to provide dispersed minute metallic palladium particles secured to the fresh non-polarized surfaces mentioned. Subsequently, upon immersion of the board 21 into the aqueous chemical nickel strike bath, a nickel strike takes place upon these particles; and still subsequently upon immersion of the board 21 into the aqueous chemical nickel plating bath, an alloy plating takes place upon these plated particles, which serve as growth nuclei, so that the thin continuous integral alloy layers 23 and 24 are produced upon the fresh non-polarized surfaces mentioned of the board 21; which integral layers 23 and 24 are intimately and tenaciously bonded to the surfaces mentioned.

Next, the front surface of the board 21 is prepared for subsequent electroplating; and more particularly an electrical insulating organic masking layer 25 is laid down upon the alloy layer 23, employing a conventional silk screen technique and utilizing a conventional silk screen organic masking material that is insoluble in water and aqueous acid solutions, but is soluble in organic solvents. For example, the usual silk screen masking enamel is insoluble in water and in aqueous acid solutions, but is readily soluble in methyl ethyl ketone. Specifically, the masking layer 25 is laid down through the silk screen so as to define or depict upon the alloy layer 23 the outlines of the electrical circuit elements of the finished printed electric circuit. By way of illustration, the masking layer 25 depicts the outlines of the resistor R and the capacitor C connected in parallel relationship between the pair of electrical terminals T1 and T2, as shown in Figs. 5 and 6.

After the masking layer 25 has been laid down upon the alloy layer 23 employing the conventional silk screen technique noted, it is then suitably dried; and thereafter the exposed surfaces of the alloy layer 23 are suitably cleaned. Then the board 21 is transferred to conventional electroplating equipment, including a copper electrode, and subjected to electroplating operations, the board 21 being immersed in an appropriate copper electroplating bath. Specifically, the alloy layer 23 is first subjected to a reverse current for about 30 to 60 seconds, in order to activate the same, the alloy layer 23 constituting the anode and the copper electrode constituting the cathode. After this activation, the alloy layer 23 is subjected to forward current in a conventional manner, the alloy layer 23 constituting the cathode and the copper electrode constituting the anode.

While a standard cyanide electroplating bath may be employed, the electroplating bath set forth below is even more advantageous in view of the circumstance that it is productive of a copper layer that is very tenaciously bonded to the alloy layer, as more fully explained hereinafter, the electroplating bath mentioned comprising an aqueous solution and having the approximate composition:

| | | |
|---|---|---|
| $Cu.(SO_4).5H_2O$ | gm./l. | 188 |
| $H_2SO_4$ conc. (66° Bé.) | cc./l. | 61.5 |
| Thiourea | gm./l. | 0.01 |
| Black strap molasses | gm./l. | 0.8 |
| Wetting agent | p.p.m. | 25 |

In passing, it is noted that after preparation of the electroplating bath mentioned, it should be filtered in order to remove therefrom any sediment; and also it is mentioned that any suitable wetting agent, such as the sodium salt of a sulfonated alkyl substituted aryl compound may be employed.

In the electroplating step, a current density of about 20–70 amps./sq. ft. (0.7–2 v.) may be employed with constant agitation of the electroplating bath.

At this time, the board 21 carries, as shown in Figs. 7 and 8, the layer of copper 26 upon the exposed surfaces of the alloy layer 23 and the layers of copper 26 upon the exposed surfaces of the alloy layers 24, the copper layers 26 and 27 being integral with each other and intimately bonded to the respective alloy layers 23 and 24. Accordingly, the copper layer 26 defines the resistor R and the capacitor C, while the copper layers 27, together with the alloy layers 24, define the terminals T1 and T2.

The masking layer 25 is then dissolved and removed from the alloy layer 23 employing a suitable organic solvent, such, for example, as methyl ethyl ketone.

At this time, the outlines of the resistor R and the capacitor C stand out in relief upon the alloy layer 23, as shown in Figs. 9 and 10.

The exposed portions or surfaces of the alloy layer 23 are then dissolved and removed from the front surface of the board 21 employing a suitable mineral acid wash, such, for example, as 1:1 nitric acid or 1:1 aqua regia or 2 parts sulfuric, 1 part nitric and ¼ part water.

Ultimately the board 21 may be sheared to any configuration that may be required in the utilization of the printed electric circuit, if a configuration of the board 21 is required other than the initial rectangular configuration thereof.

At this time, the finished printed electric circuit is produced, as shown in Figs. 11 and 12, whereby it will be understood that the terminals T1 and T2 comprise the composite of the residual alloy layers 24 and the copper layers 26 and 27; while the circuit elements R and C comprise the composite of the residual alloy layer 23 and the copper layer 26. Moreover, the circuit elements R and C are connected in parallel relation between the terminals T1 and T2, while the terminals mentioned are securely anchored in place in the holes 22 formed in the insulating board 21.

In the finished printed electric circuit 20, the circuit elements R and C are firmly anchored upon the front surface of the insulating board 21 and are integrally united with the terminals T1 and T2 thereby to provide a printed electric circuit having predetermined and fixed electrical characteristics throughout its useful long operating life. Furthermore, it will be understood that any circuit elements that may be carried upon the rear surface of the insulating board 21 are formed thereon simultaneously with the formation of the circuit elements R and C on the front surface of the insulating board 21, as described above, and that any interconnections required between the circuit elements respectively carried upon the front and rear surfaces of the insulating board 21 are accomplished through the terminals T1, T2, etc., whereby the interconnected circuit elements carried on the respective surfaces of the insulating board 21 are integrally united by the terminals T1, T2, etc.

In the foregoing example, the chemical nickel plating process was described as a step in the method of making the printed electric circuit, and it is indeed ideally suited to this method, but it will be understood that this process is in no way peculiar to this method. More particularly, the chemical nickel plating process is of general utility in the nickel plating of a wide variety of non-metallic bodies formed of such materials as: natural and synthetic plastics, wood, quartz, glass, ceramics, etc. Moreover, since the nickel strike bath described is employed at room temperature, the synthetic plastic materials may be either of the thermosetting class (phenol-aldehyde resins, polyalcohol-phthalic resins, urea-formaldehyde resins, etc.) or of the thermoplastic class (vinyl polymers, styrol resins, cellulose derivatives, casein materials, superpolyamides, acrylate polymers, etc.).

Considering now more particularly the aqueous chemical nickel strike bath, it is noted that while the optimum composition thereof is that previously set forth, the preferred composition thereof is as follows:

(1) Nickel ions—an absolute concentration in the approximate range: 0.07 to 0.10 mole per liter.

(2) Hypophosphite ions—a ratio between nickel ions and hypophosphite ions in the approximate range: 0.45 to 0.55.

(3) Acetate ions—a ratio between nickel ions and acetate ions in the approximate range: 1.45 to 1.55.

(4) Ammonium ions—an absolute concentration in the approximate range: 0.015 to 0.030 mole per liter.

(5) Ortho-boric acid—an absolute concentration in the approximate range: 0.015 to 0.030 mole per liter.

(6) pH—within the range 5.5 to 6.0, adjust with sodium bicarbonate or sulfuric acid, as required.

In preparing this nickel strike bath the utilization of nickel hypophosphite is very convenient as it automatically establishes a ratio between nickel ions and hypophosphite ions of 0.5, but other soluble nickel salts (nickel sulfate, nickel chloride, etc.) may be used in conjunction with other soluble hypophosphites (sodium hypophosphite, calcium hypophosphite, potassium hypophosphite, etc.). Similarly, the ammonium ions may be derived from a wide variety of soluble ammonium compounds (ammonium sulfate, ammonium chloride, ammonium hydroxide, etc.), as it will be appreciated that it is the ammonium radical of this ingredient that is useful as a weak alkali to neutralize the boric acid, thus forming a buffer active in the proper pH region.

Likewise, the acetate ions may be derived from a wide variety of soluble acetates (sodium acetate, calcium acetate, potassium acetate, acetic acid, etc.), as it will be appreciated that not only is the acetate a buffer (preventing substantial reduction in pH as the nickel ion reduction—hypophosphite ion oxidation mechanism proceeds) in the aqueous bath, but the acetate ion is a mild exaltant (increasing somewhat the plating or striking rate) in the aqueous bath.

While there are a few soluble ortho-borates, other than ortho-boric acid, that might be used in preparing the strike bath, there is no point to the use thereof, since the ortho-borate ions immediately hydrolyze in the aqueous solution:

$$(BO_3^{---}+2H_2O \rightarrow H_2BO_3^{-}+2OH^{-})$$

to produce exactly the same borate ions that result from the use of ortho-boric acid in the aqueous solution:

$$(H_3BO_3 \rightarrow H^{+}+H_2BO_3^{-})$$

Now in the aqueous bath, the boric acid also serves as a buffer, and the concentration thereof should be low, since the buffering action thereof increases with dilution in the range mentioned.

This chemical nickel strike bath was expressly composed for operation at or near room temperature (70° F. to 75° F.) and is thermally unstable at temperatures substantially thereabove; whereby the upper temperature limit thereof is about 85° F. As the temperature of the bath is reduced below room temperature, the plating or striking rate falls off substantially, whereby the lower temperature limit is about 50° F. from a practical standpoint. The relationship between temperatures and plating rates of the bath are about as follows:

| | Mil./hr. |
|---|---|
| 50° F. | 0.03 |
| 70° F. | 0.04 |
| 85° F. | 0.05 |

While the pH of the chemical nickel strike bath may vary considerably, as far as operability is concerned, the stability thereof is impaired at high pH and the plating rate is impaired at low pH; whereby, from the operating range of pH—5.0 to 12.0, it is recommended that only the narrow band of pH—5.5 to 6.0 be used, and that the specific pH—5.8 be employed as a practical matter.

In the present process of plating upon nonmetallic bodies, the utilization of the chemical nickel strike bath, preceding the utilization of the chemical nickel plating bath, is very advantageous as there is virtually no nickel plating initiation time (time required for the nickel plating upon the dispersed growth nuclei palladium particles to begin) involved in the use of the strike bath, and the adhesion of the nickel layer (the principal portion of which is deposited by the plating bath) upon the bodies is very much improved. Moreover, the nickel layer (really a nickel-phosphorus alloy layer) is ideally suited to receive the subsequent copper layer, as the electrodeposition of the copper is greatly simplified by the nickel layer of good conductivity. Furthermore, the bond between the copper, deposited electrically, and the nickel, deposited chemically, is remarkable, as there is absolutely no peeling, blistering, spalling, or separation of any kind, in every test that has yet been devised for studying this bond.

In the manufacture of a printed electric circuit designed to carry exceedingly small electric currents, the method can be modified in an obvious manner by prolonging the chemical nickel plating step and by omitting the copper plating step. Of course, in the resulting printed electric circuit the circuit elements are integral, as previously explained, but formed entirely in this modification of the described nickel-phosphorus alloy.

While there has been described what is at present considered to be the preferred embodiment of the invention, it will be understood that various modifications may be made therein, and it is intended to cover in the appended claims all such modifications as fall within the true spirit and scope of the invention.

What is claimed is:

1. A printed electric circuit comprising an insulating base, and a composite electric circuit element carried by the surface of said base and including inner and outer electrically conducting metal layers disposed in metal-to-metal contact with each other, said inner layer being directly and intimately adhered to the surface of said base and consisting essentially of a nickel-phosphorus alloy, said alloy containing by weight about 89% to 95% nickel and about 5% to 11% phosphorus, said outer layer being directly and intimately adhered to said inner layer and consisting essentially of copper.

2. The printed electric circuit set forth in claim 1, wherein said base is formed of a textile reinforced thermoset resin consisting essentially of phenol-formaldehyde condensation products.

3. A printed electric circuit comprising an insulating base having a hole therethrough, a composite hollow terminal carried by said base within said hole and including inner and outer electrically conducting metal layers disposed in metal-to-metal contact with each other, said inner layer being directly and intimately adhered to the wall of said base surrounding said hole and consisting essentially of a nickel-phosphorus alloy, said alloy containing by weight about 89% to 95% nickel and about 5% to 11% phosphorus, said outer layer being directly and intimately adhered to said inner layer and consisting essentially of copper, and an electrically conducting circuit element carried upon the face of said base and electrically connected to said terminal.

4. The printed electric circuit set forth in claim 3, wherein said base is formed of a textile reinforced thermoset resin consisting essentially of phenol-formaldehyde condensation products.

5. A printed electric circuit comprising an insulating board having a pair of spaced-apart holes therein, a pair of hollow terminals carried by said board respectively within said holes and intimately adhered to the respectively adjacent surfaces thereof, and a composite circuit element carried by the surface of said board and extending between said terminals, said circuit element including inner and outer electrically conducting metal layers disposed in metal-to-metal contact with each other, said inner layer being directly and intimately adhered to the surface of said board and said outer layer being directly and intimately adhered to the surface of said inner layer, said inner and outer layers being formed of different electrically conducting metals, and said terminals and said inner layer being of integral construction and consisting essentially of a nickel-phosphorus alloy containing by weight about 89% to 95% nickel and about 5% to 11% phosphorus.

6. A printed electric circuit comprising an insulating board having a hole therethrough, a hollow terminal carried by said board within said hole and intimately adhered to the adjacent surface thereof, and a pair of composite circuit elements respectively carried by the surfaces of said board and respectively extending to the adjacent ends of said terminal, each of said circuit elements including inner and outer electrically conducting metal layers disposed in metal-to-metal contact with each other, said inner layers being directly and intimately adhered to the respectively adjacent surfaces of said board and said outer layers being directly and intimately adhered to the respectively adjacent surfaces of said inner layers, said inner and outer layers in each of said circuit elements being formed of different electrically conducting metals, and said terminal and said inner layer in each of said circuit elements being of integral construction and consisting essentially of a nickel-phosphorus alloy containing by weight about 89% to 95% nickel and about 5% to 11% phosphorus.

7. A printed electric circuit comprising an insulating board, and a composite electric circuit element carried by the surface of said board and including inner and outer electrically conducting metal layers disposed in metal-to-metal contact with each other, said inner layer being directly and intimately adhered to the surface of said board and said outer layer being directly and intimately adhered to the surface of said inner layer, said inner and outer layers being formed of different electrically conducting metals, and said inner layer consisting essentially of a nickel-phosphorus alloy containing by weight about 89% to 95% nickel and about 5% to 11% phosphorus.

8. In an article of manufacture, a construction comprising three superimposed layers including a non-metallic supporting base layer and a metallic intermediate layer and a metallic surface layer, said intermediate layer being directly and intimately adhered to the adjacent surface of said base layer and consisting essentially of a nickel-phosphorus alloy, said alloy containing by weight about 89% to 95% nickel and about 5% to 11% phosphorus, and said surface layer being directly and intimately adhered to the adjacent surface of said intermediate layer and consisting essentially of copper, whereby said intermediate layer and said surface layer are in metal-to-metal contact with each other.

9. The article of manufacture set forth in claim 8, wherein said base layer is formed essentially of a substance selected from the class consisting of glass material, ceramic material and plastic material.

References Cited in the file of this patent

UNITED STATES PATENTS

| | | |
|---|---|---|
| 2,474,988 | Sargrove | July 5, 1949 |
| 2,532,283 | Brenner | Dec. 5, 1950 |
| 2,662,957 | Eisler | Dec. 15, 1953 |
| 2,690,403 | Gutzeit | Sept. 28, 1954 |
| 2,758,074 | Black | Aug. 7, 1956 |
| 2,834,723 | Robinson | May 13, 1958 |
| 2,848,359 | Talmey | Aug. 19, 1958 |